(12) United States Patent
Chen et al.

(10) Patent No.: US 12,501,732 B2
(45) Date of Patent: Dec. 16, 2025

(54) PIXEL SENSOR INCLUDING REFRACTION STRUCTURES

(71) Applicant: Taiwan Semiconductor Manufacturing Company, Ltd., Hsinchu (TW)

(72) Inventors: Wei-Lin Chen, Tainan (TW); Chun-Hao Chou, Tainan (TW); Kuo-Cheng Lee, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 453 days.

(21) Appl. No.: 17/249,311

(22) Filed: Feb. 26, 2021

(65) Prior Publication Data

US 2022/0278143 A1    Sep. 1, 2022

(51) Int. Cl.
*H10F 39/00*    (2025.01)
*H10F 39/18*    (2025.01)

(52) U.S. Cl.
CPC ......... *H10F 39/807* (2025.01); *H10F 39/182* (2025.01)

(58) Field of Classification Search
None
See application file for complete search history.

(56) References Cited

U.S. PATENT DOCUMENTS

| | | | | |
|---|---|---|---|---|
| 10,586,824 | B2 * | 3/2020 | Kim | H10F 39/151 |
| 2018/0190707 | A1 * | 7/2018 | Lee | H10F 39/8037 |
| 2019/0165026 | A1 * | 5/2019 | Kuo | H10F 39/807 |
| 2019/0296070 | A1 * | 9/2019 | Jin | H10F 39/805 |
| 2020/0006410 | A1 * | 1/2020 | Wu | H10F 39/199 |
| 2020/0058684 | A1 * | 2/2020 | Wu | H10F 39/8033 |

\* cited by examiner

*Primary Examiner* — Ali Naraghi
(74) *Attorney, Agent, or Firm* — Harrity & Harrity, LLP

(57) ABSTRACT

A pixel sensor may include a main deep trench isolation (DTI) structure and one or more sub-DTI structures in a substrate of the pixel sensor to increase the quantum efficiency of the pixel sensor at large incident angles. The one or more sub-DTI structures may be located within the perimeter of the main DTI structure and above a photodiode. The one or more sub-DTI structures may be configured to provide a path of travel for incident light into the photodiode from large incident angles in that the one or more sub-DTI structures may be filled with an oxide material to increase light penetration into the one or more sub-DTI structures. This may reduce reflections at a top surface of the substrate, thereby permitting incident light to refract into the substrate and toward the photodiode.

20 Claims, 16 Drawing Sheets

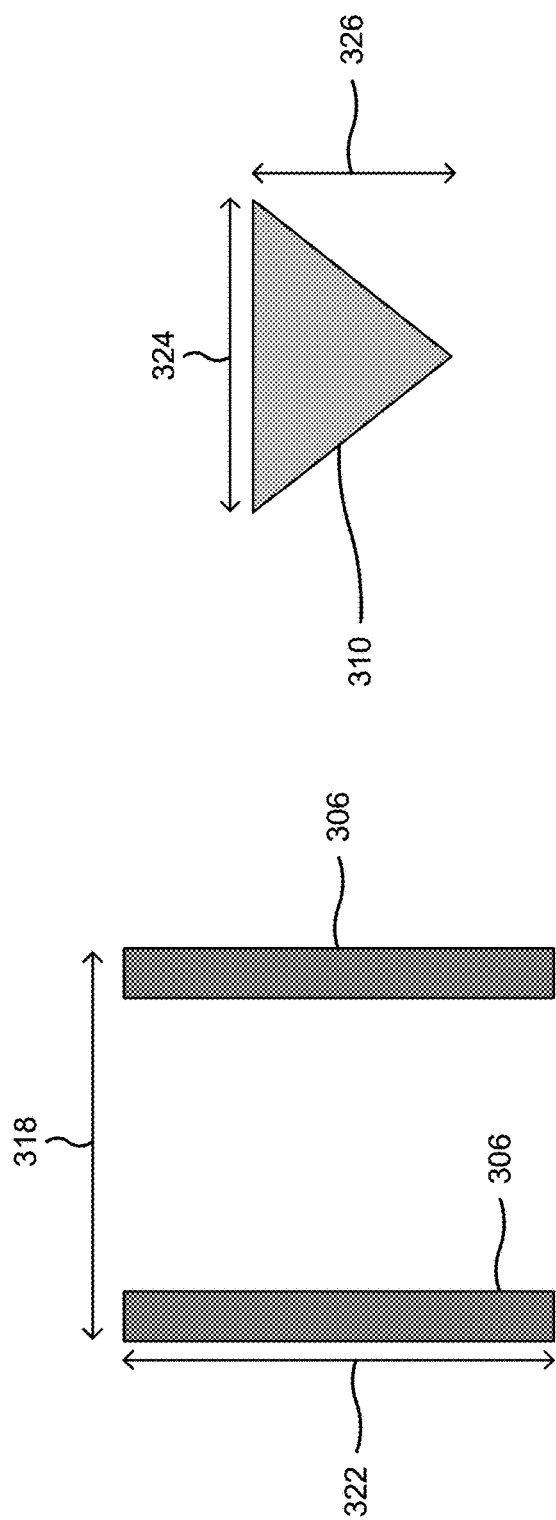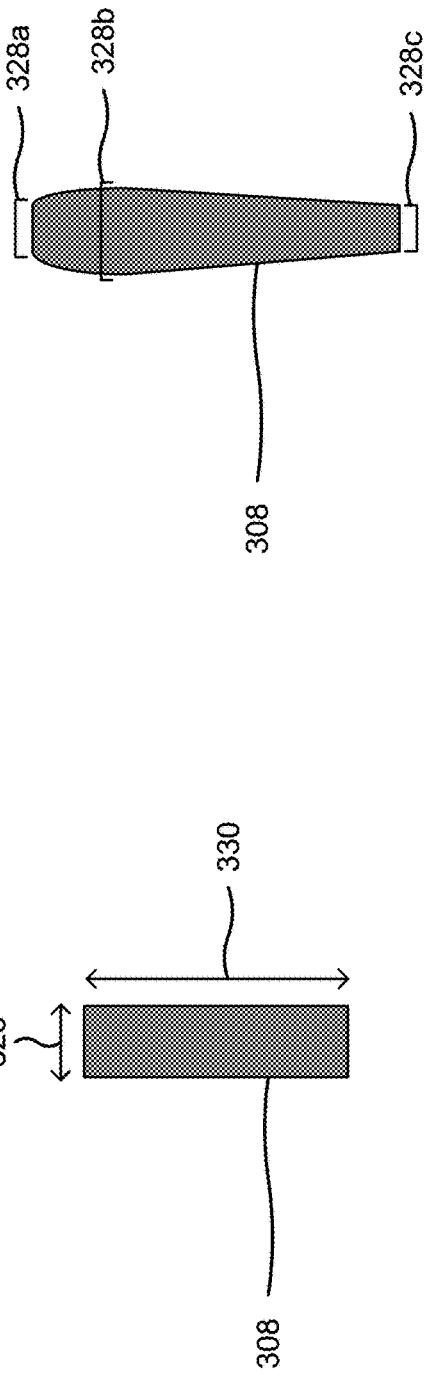

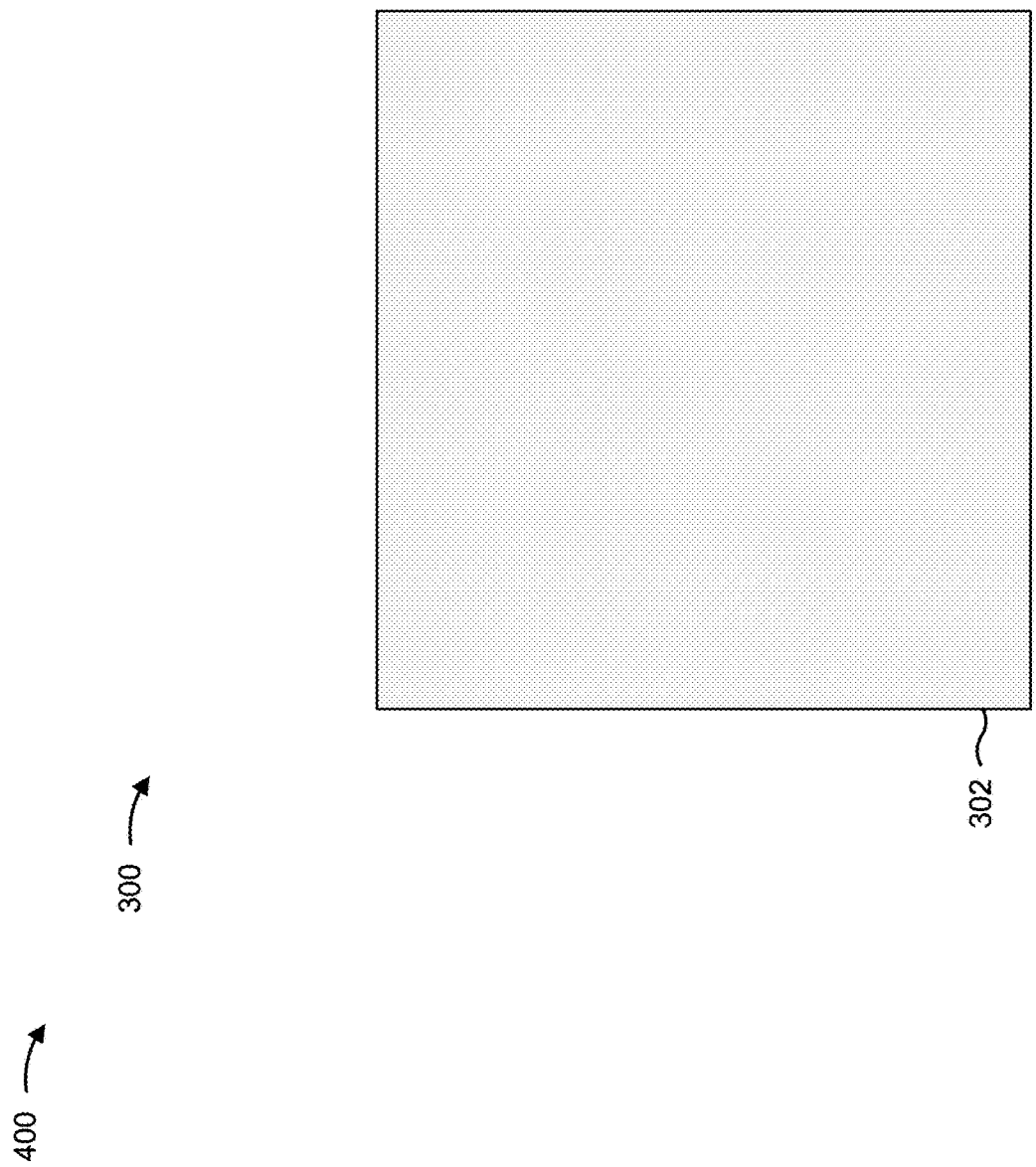

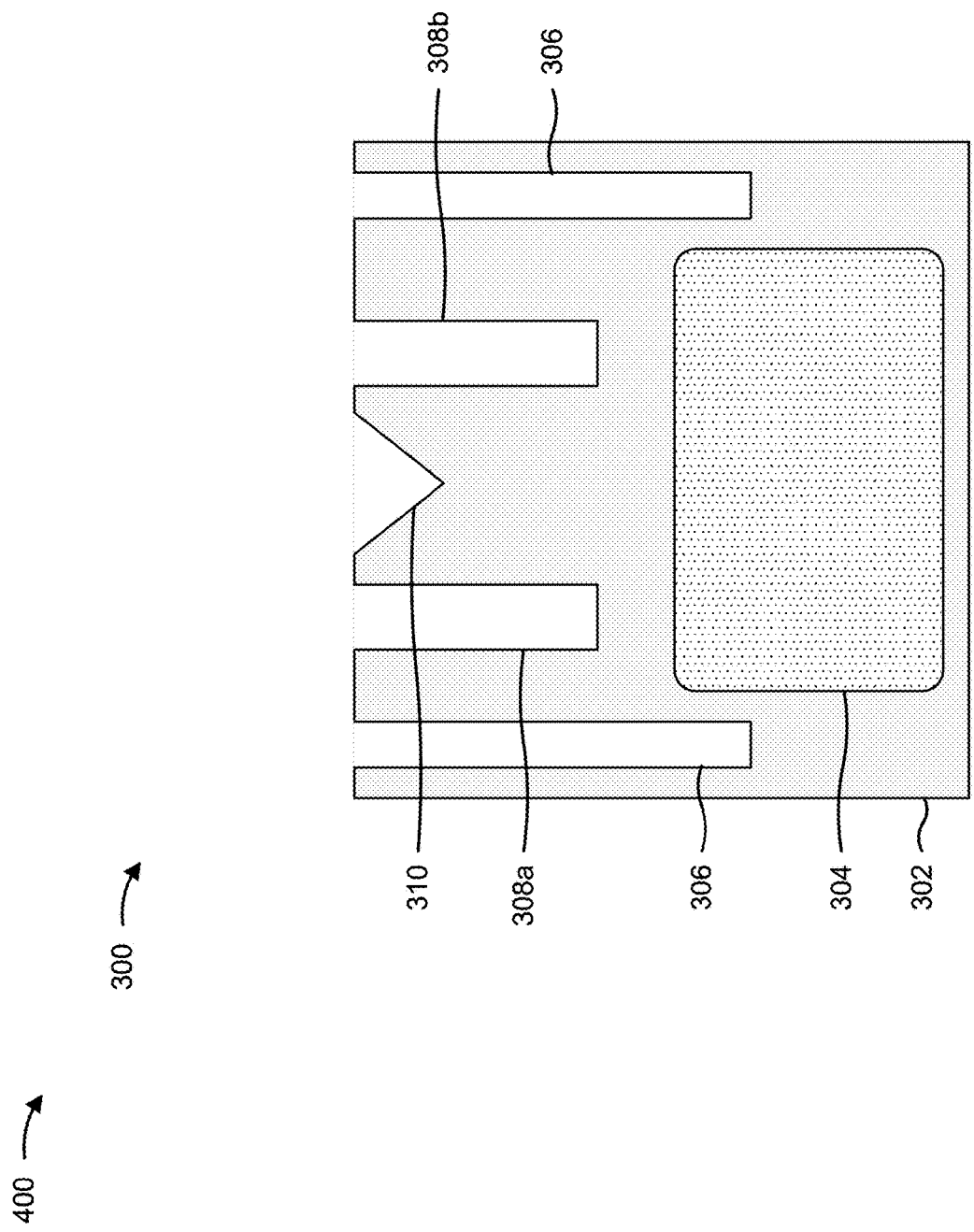

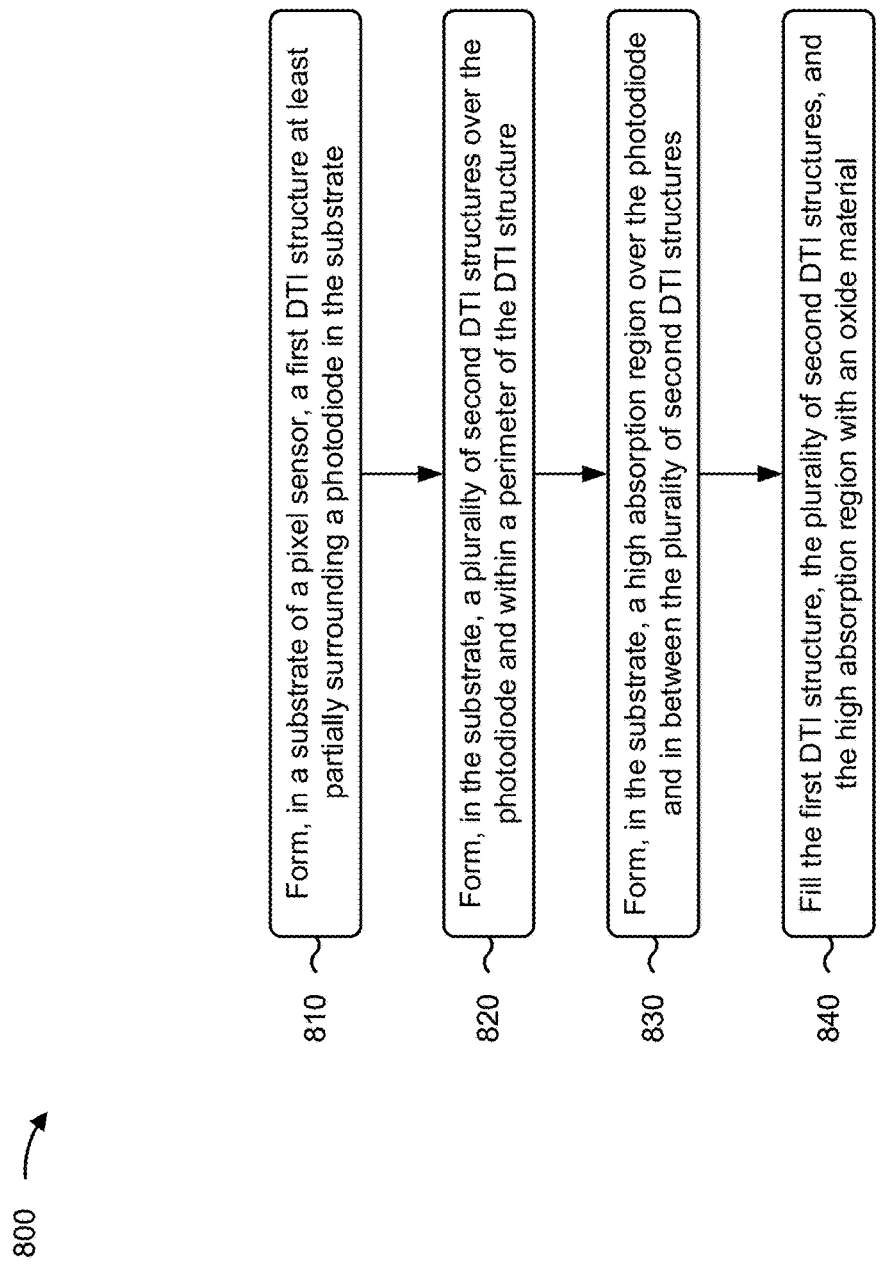

PIXEL SENSOR INCLUDING REFRACTION STRUCTURES

BACKGROUND

Complementary metal oxide semiconductor (CMOS) image sensors utilize light-sensitive CMOS circuitry to convert light energy into electrical energy. The light-sensitive CMOS circuitry may include a photodiode formed in a silicon substrate. As the photodiode is exposed to light, an electrical charge is induced in the photodiode (referred to as a photocurrent). The photodiode may be coupled to a switching transistor, which is used to sample the charge of the photodiode. Colors may be determined by placing filters over the light-sensitive CMOS circuitry.

Light received by pixel sensors of a CMOS image sensor is often based on the three primary colors: red, green, and blue (R, G, B). Pixel sensors that sense light for each color can be defined through the use of a color filter that allows the light wavelength for a particular color to pass into a photodiode. Some pixel sensors may include a near infrared (NIR) pass filter, which blocks visible light and passes NIR light through to the photodiode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3F are diagrams of an example pixel sensor described herein.

FIGS. 4A-4G are diagrams of an example implementation described herein.

FIG. 8 is a flowchart of an example process relating to forming a pixel sensor.

DETAILED DESCRIPTION

Figure 1:
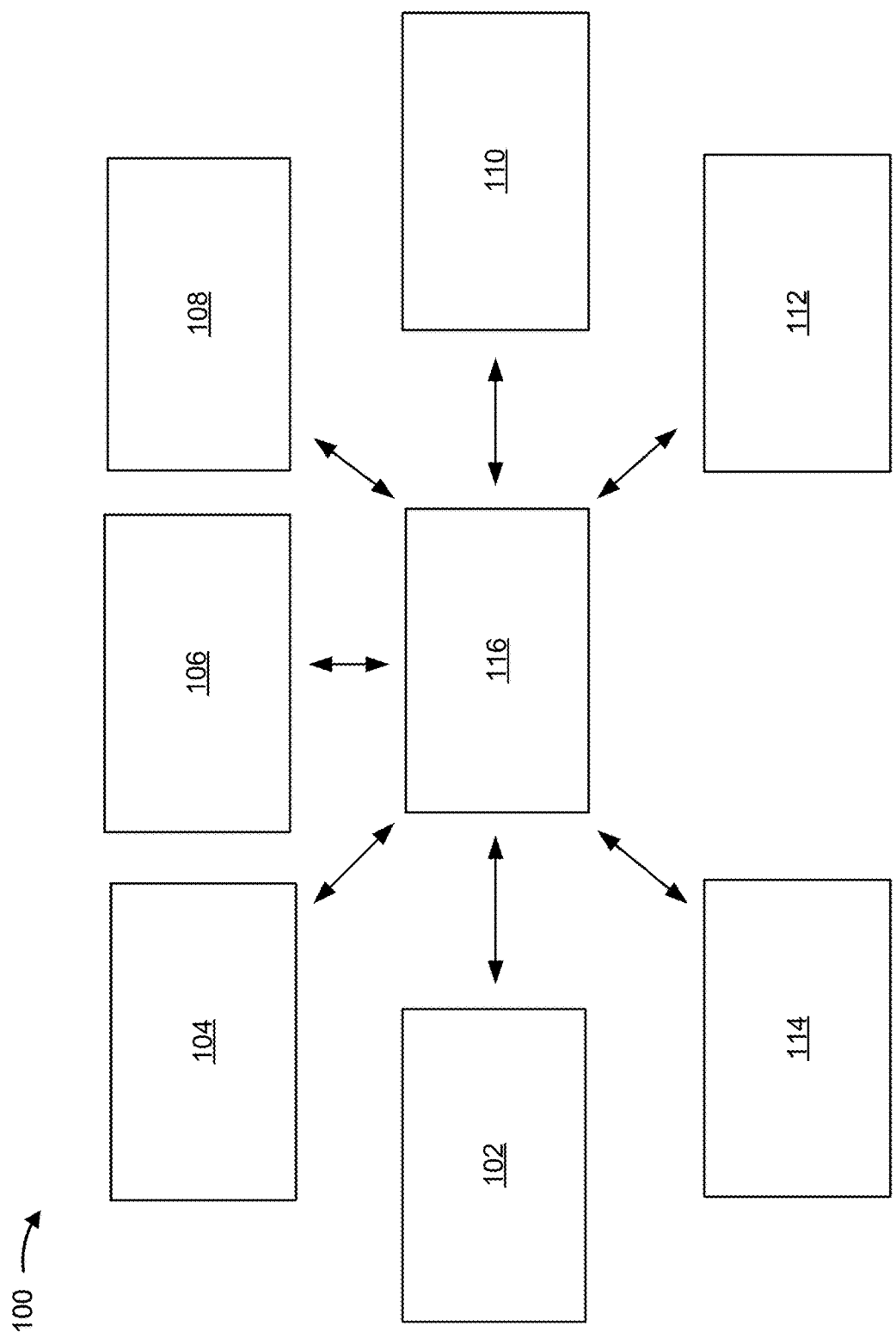
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Cameras that include a complementary metal oxide semiconductor (CMOS) image sensor may operate on an f-number system in which f-numbers (or f-stops) correspond to different ratios of focal length and aperture size. Smaller f-numbers correspond to smaller ratios (e.g., short focal lengths and large aperture sizes), and larger f-numbers correspond to larger ratios (e.g., large focal lengths and small aperture sizes). At a small f-number (e.g., f/1.4), a pixel sensor of a CMOS image sensor may collect incident light across a larger aperture diameter and at a shorter focal length. While this allows the photodiode of the pixel sensor to collect a greater amount of incident light than at a larger f-number, the incident light may enter the pixel sensor across a large range of incident angles. Incident light may reflect off of the top surface of the substrate of the pixel sensor at larger incident angles (e.g., 20-40 degrees), which may decrease the quantum efficiency of the pixel sensor at larger incident angles and may hinder the performance of the CMOS image sensor.

Some implementations described herein provide a pixel sensor that includes a main deep trench isolation (DTI) structure and one or more sub-DTI structures in a substrate of the pixel sensor to increase the quantum efficiency of the pixel sensor at large incident angles. The main DTI structure may at least partially surround the photodiode of the pixel sensor, and may be configured to reduce crosstalk and reflect incident light toward the photodiode. The one or more sub-DTI structures may be included at various locations within the perimeter of the main DTI structure and above the photodiode. The one or more sub-DTI structures may be configured to provide a path of travel for incident light into the photodiode from large incident angles in that the one or more sub-DTI structures may be filled with an oxide material to increase light penetration into the one or more sub-DTI structures. This may reduce reflections at the top surface of the substrate, thereby permitting incident light to refract into the substrate and toward the photodiode. Accordingly, the one or more sub-DTI structures may increase the quantum efficiency of the pixel sensor at large incident angles, may reduce optical crosstalk, and/or may increase the low-light performance of a camera in which the pixel sensor is included.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 116 includes a mobile robot, a robot arm, a tram or rail car, an overhead hoist transport (OHT) system, an automated materially handling system (AMHS), and/or another type of device that is used to transport wafers and/or dies between semiconductor processing tools 102-114 and/or to and from other locations such as a wafer rack, a storage room, and/or the like. In some implementations, wafer/die transport tool 116 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
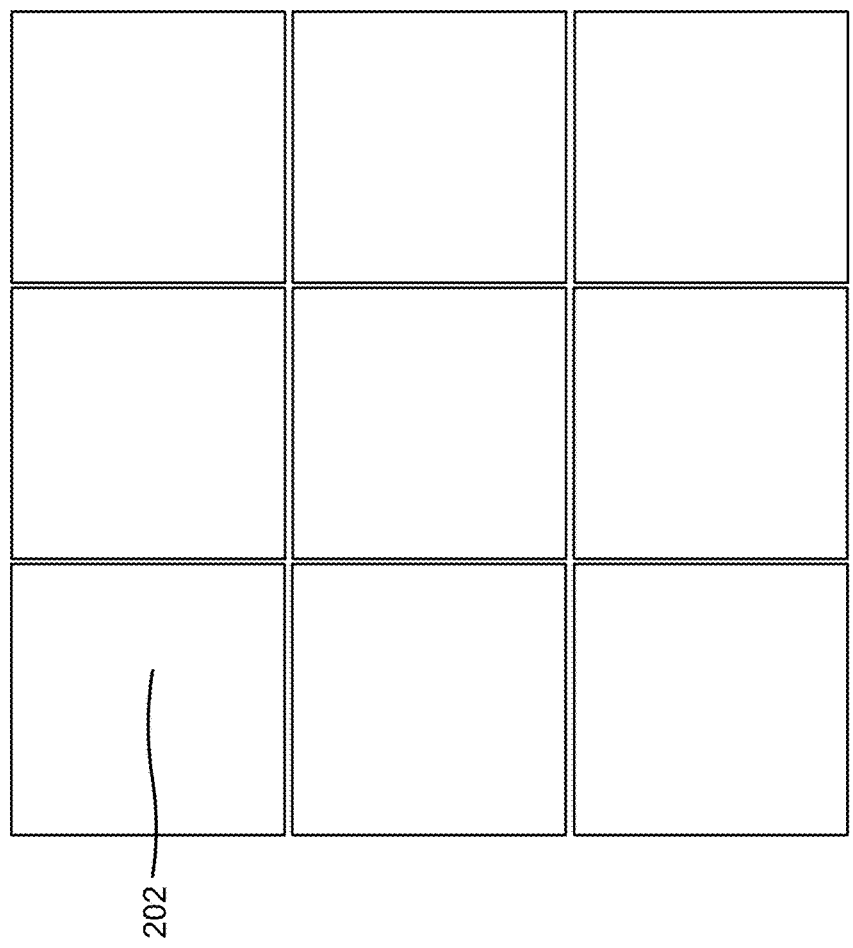
FIG. 2 is a diagram of an example pixel array described herein.

FIG. 2 shows a top-down view of the pixel array 200. As shown in FIG. 2, the pixel array 200 may include a plurality of pixel sensors 202. As further shown in FIG. 2, the pixel sensors 202 may be arranged in a grid. In some implementations, the pixel sensors 202 are square-shaped (as shown in the example in FIG. 2). In some implementations, the pixel sensors 202 include other shapes such as circle shapes, octagon shapes, diamond shapes, and/or other shapes.

The pixel sensors 202 may be configured to sense and/or accumulate incident light (e.g., light directed toward the pixel array 200). For example, a pixel sensor 202 may absorb and accumulate photons of the incident light in a photodiode. The accumulation of photons in the photodiode may generate a charge representing the intensity or brightness of the incident light (e.g., a greater amount of charge may correspond to a greater intensity or brightness, and a lower amount of charge may correspond to a lower intensity or brightness).

The pixel array 200 may be electrically connected to a back-end-of-line (BEOL) metallization stack (not shown) of the image sensor. The BEOL metallization stack may electrically connect the pixel array 200 to control circuitry that may be used to measure the accumulation of incident light in the pixel sensors 202 and convert the measurements to an electrical signal.

As indicated above, FIG. 2 is provided as an example. Other examples may differ from what is described with regard to FIG. 2.

FIGS. 3A-3F are diagrams of an example pixel sensor 300 described herein. The pixel sensor 300 may include a main DTI structure and one or more sub-DTI structures in a substrate of the pixel sensor 300 to increase the quantum efficiency of the pixel sensor 300 by promoting absorption of incident light particularly at incident angles of approximately +/−10 degrees or wider. In some implementations, the pixel sensor 300 may be configured as and/or may implement a pixel sensor 202 included in the pixel array 200. In some implementations, the pixel sensor 300 may be included in an image sensor. The image sensor may be a CMOS image sensor, a backside illuminated (BSI) CMOS image sensor, or another type of image sensor.

Figure 3A:
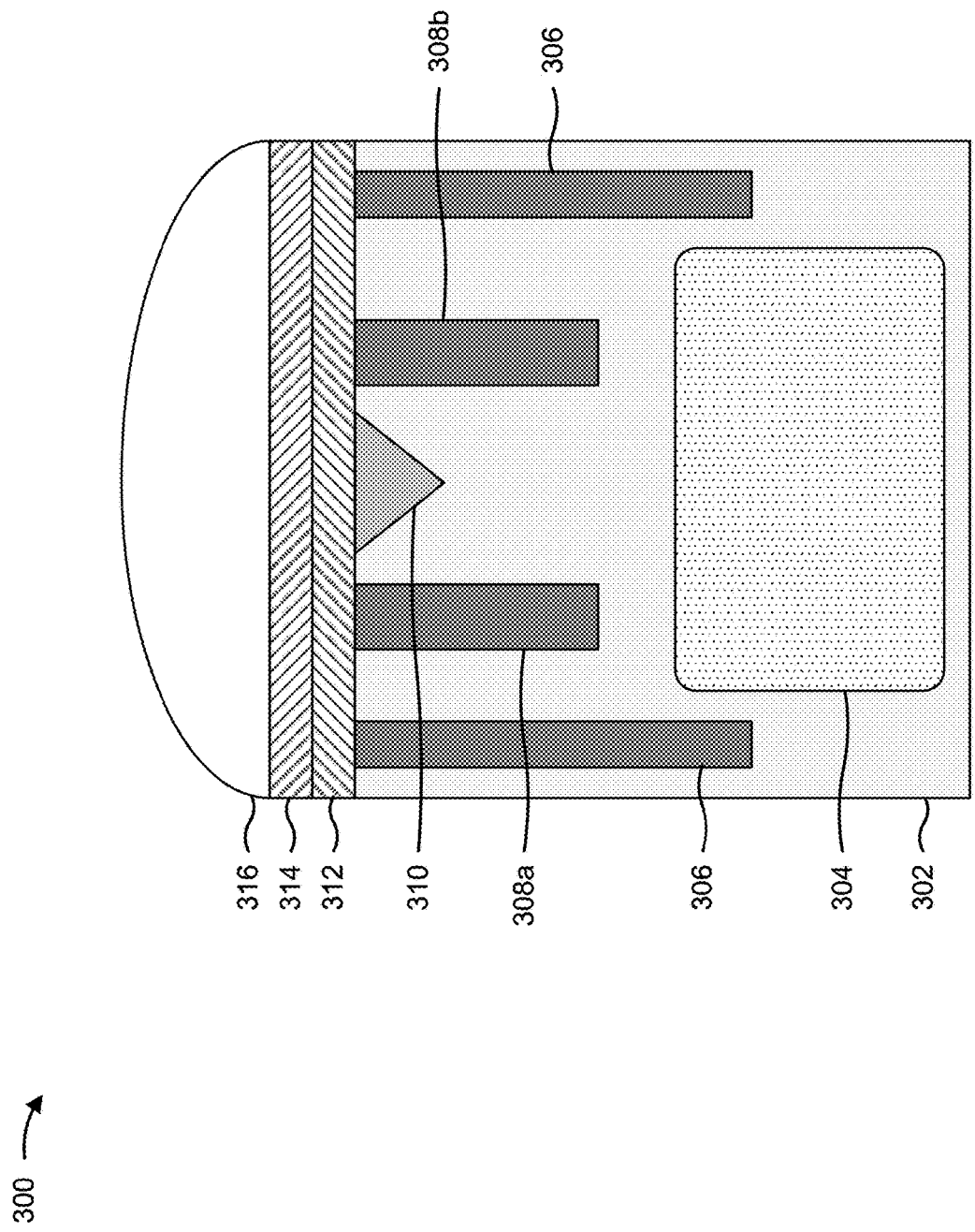

FIG. 3A illustrates a cross-section view of the pixel sensor 300. As shown in FIG. 3A, the pixel sensor 300 may include a substrate 302. The substrate 302 may include a semiconductor die substrate, a semiconductor wafer, or another type of substrate in which semiconductor pixels may be formed. In some implementations, the substrate 302 is formed of silicon (Si), a material including silicon, a III-V compound semiconductor material such as gallium arsenide (GaAs), a silicon on insulator (SOI), or another type of semiconductor material that is capable of generating a charge from photons of incident light. In some implementations, the substrate 302 is formed of a doped material (e.g., a p-doped material or an n-doped material) such as a doped silicon.

The pixel sensor 300 may include a photodiode 304 included in the substrate 302 (e.g., below a top surface of the substrate). The photodiode 304 may include a plurality of regions that are doped with various types of ions to form a p-n junction or a PIN junction (e.g., a junction between a p-type portion, an intrinsic (or undoped) type portion, and an n-type portion). For example, the substrate 302 may be doped with an n-type dopant to form one or more n-type regions of the photodiode 304, and/or the substrate 302 may be doped with a p-type dopant to form one or more p-type regions of the photodiode 304. The photodiode 304 may be configured to absorb photons of incident light. The absorption of photons causes the photodiode 304 to accumulate a charge (referred to as a photocurrent) due to the photoelectric effect. Photons may bombard the photodiode 304, which causes emission of electrons in the photodiode 304.

A DTI structure 306 may be included in the substrate 302. In some implementations, the DTI structure 306 may include a backside DTI (BDTI) structure that is formed as a part of back side processing of the pixel sensor. The DTI structure 306 may be filled with an oxide material such as a silicon oxide ($SiO_x$). The DTI structure 306 may include a trench (e.g., a deep trench) that extends downward into the substrate 302 along at least a portion of the photodiode 304 and encircles the area of the pixel sensor 300, thereby defining the perimeter of the pixel sensor 300. The DTI structure 306 may at least partially surround the photodiode 304 to reduce optical and electrical crosstalk between the pixel sensor 300 and an adjacent pixel sensor and to increase photon absorption of the photodiode 304 (and thus, the quantum efficiency of the pixel sensor 300). In particular, the DTI structure 306 may absorb, refract, and/or reflect photons of incident light, which may reduce the amount of incident light that travels through the pixel sensor 300 into an adjacent pixel sensor and/or may increase the amount of incident light that is reflected toward the photodiode 304.

The pixel sensor 300 may include one or more refraction structures 308 (e.g., a refraction structure 308a, a refraction structure 308b) in the substrate 302. The one or more refraction structures 308 may be referred to as sub-DTI structures (or sub-BDTI structures) in that the one or more refraction structures 308 are located within the perimeter or inner boundary of the DTI structure 306 and are generally physically smaller than the DTI structure 306. Each refraction structure 308 may include a DTI structure, a shallow trench isolation (STI) structure, a trench, an opening, or another structure that is formed into the substrate 302 and extends from the top surface of the substrate 302 toward the photodiode 304. The one or more refraction structures 308 may be filled with an oxide material such as a silicon oxide ($SiO_x$). The one or more refraction structures 308 and the oxide material included therein are configured to decrease the amount of incident light that is reflected off of the top surface of the substrate 302, and are configured to refract incident light into the substrate 302 toward the photodiode 304. In this way, the one or more refraction structures promote the absorption of incident light at the photodiode 304, particularly at incident angles wider than +/−10 degrees.

The pixel sensor 300 may include a high absorption region 310 in the substrate 302. The high absorption region 310 may be located near a center of the pixel sensor 300 within the perimeter or inner boundary of the DTI structure 306 such that the high absorption region 310 is located above and/or over the photodiode 304. The high absorption region 310 may include a shallow trench that is filled with an oxide material such as a silicon oxide ($SiO_x$). The high absorption region 310 may include a structure having angled walls such that the structure is approximately triangular-shaped in a cross-sectional view and an approximate pyramid three-dimensional shape. The high absorption region 310 may extend from the top surface of the substrate 302 (e.g., the same surface as the DTI structure 306 and the one or more refraction structures 308) into the substrate 302 over and toward approximately the center the photodiode 304.

The high absorption region 310 may increase the absorption of incident light for the pixel sensor 300 (thereby increasing the quantum efficiency of the pixel sensor 300) by modifying or changing the orientation of the refractive interface of a portion of the top surface of the substrate 302. The angled walls of the high absorption region 310 change the orientation of the interface between the substrate 302 and the oxide material included in the substrate, thereby causing the interface to be diagonal relative to the orientation of the planar portions of the top surface. This change in orientation may result in a smaller angle of refraction relative to the planar portions for the same angle of incidence of incident light. As a result, the high absorption region 310 may be capable of directing wider angles of incident light toward the center of the photodiode 304 of the pixel sensor 300 than if no high absorption region 310 were included in the pixel sensor 300.

As further shown in FIG. 3A, an antireflective coating (ARC) 312 may be included over and/or on the top surface of the substrate 302. The ARC 312 may include a suitable material for reducing a reflection of incident light projected toward the photodiode 304. For example, the ARC 312 may include nitrogen-containing material.

A color filter layer 314 may be included above and/or on the ARC 312. In some implementations, the color filter layer 314 includes a visible light color filter configured to filter a particular wavelength or a particular wavelength range of visible light (e.g., red light, blue light, or green light). In some implementations, the color filter layer 314 includes a near infrared (NIR) filter (e.g., a NIR bandpass filter) configured to permit wavelengths associated with NIR light to pass through the color filter layer 314 and to block other wavelengths of light. In some implementations, the color filter layer 314 includes a NIR cut filter configured to block NIR light from passing through the color filter layer 314. In some implementations, the color filter layer 314 is omitted from the pixel sensor 300 to permit all wavelengths of light to pass through to the photodiode 304. In these examples, the pixel sensor 300 may be configured as a white pixel sensor.

A micro-lens layer 316 may be included above and/or on the color filter layer 314. The micro-lens layer 316 may include a micro-lens for the pixel sensor 300 configured to focus incident light toward the photodiode 304 and/or to reduce optical crosstalk between the pixel sensor 300 and adjacent pixel sensors.

Figure 3B:
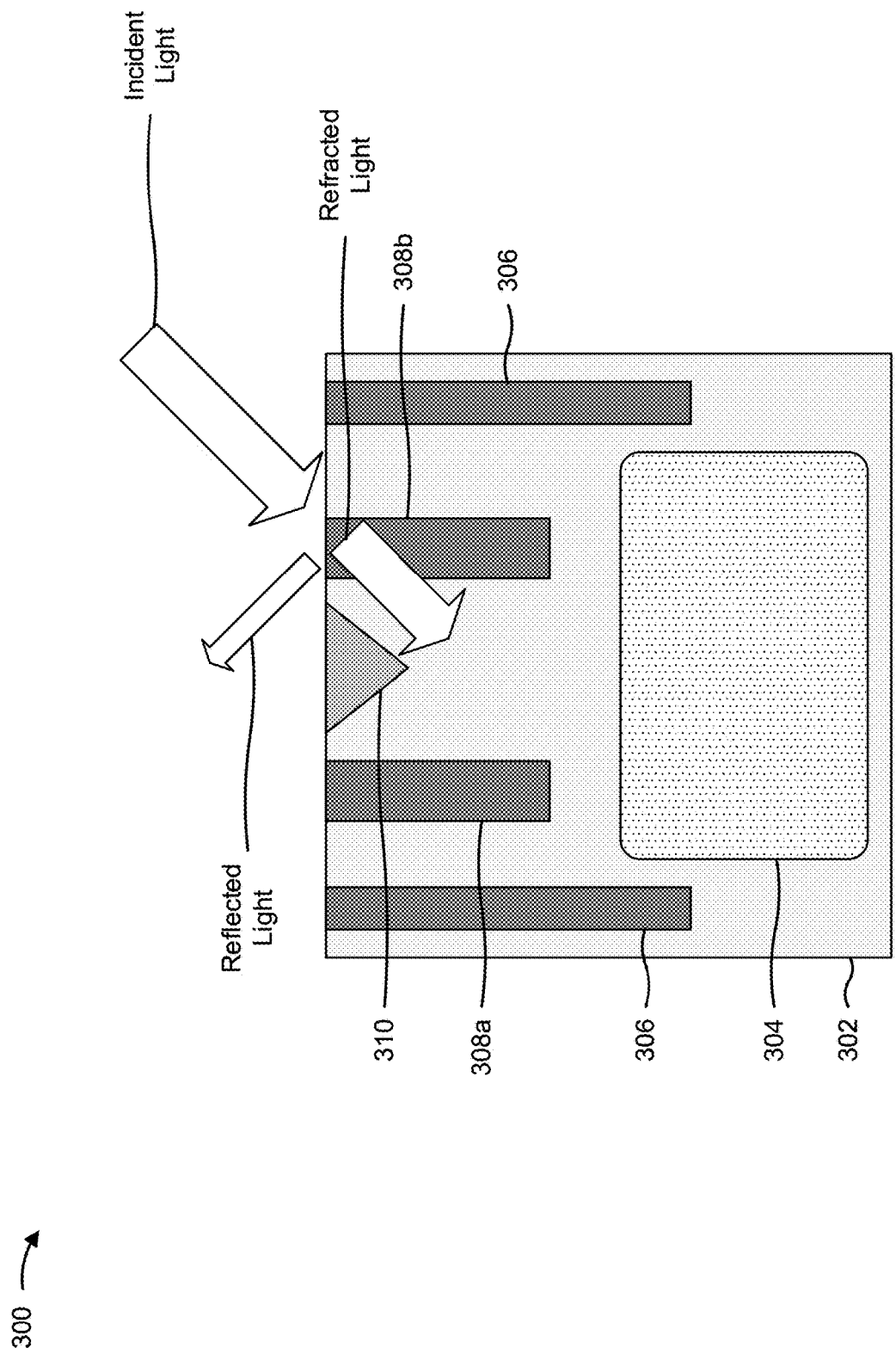

As shown in FIG. 3B, the oxide material in the one or more refraction structures 308 may provide a path by which incident light at high or large incident angles (e.g., greater than approximately 10 degrees) can refract beneath the top planar surface of the substrate 302. The planar surface of the substrate 302 (which may include silicon) may cause light to reflect off of the top surface, which may result in decreased quantum efficiency (as the reflected photons of the incident light are not absorbed in the photodiode 304). The oxide material is more easily penetrable by photons of incident light, which permits more horizontal paths of incident light (associated with high or large incident angles) to diffuse below the top surface of the substrate 302 and into the photodiode 304. The refraction structures 308 (and the oxide material included therein) may be particularly effective in refracting incident light at wavelengths corresponding to near infrared (NIR) light due to the longer wavelength of NIR light being more susceptible to reflection off of the top surface of the substrate 302, thereby promoting the absorption of NIR light by the photodiode 304.

FIG. 3C illustrates various dimensional parameters of the DTI structure 306. As shown in FIG. 3C, a dimensional parameter of the DTI structure 306 may include an outside width (or a diameter) 318 of the outer perimeter of the DTI structure 306. The outside width 318 may correspond to the overall width or size of the pixel sensor 300. As an example, the outside width 318 of the DTI structure 306 (and thus, the overall width of the pixel sensor 300) may be approximately 2 microns. However, other values for the outside width 318 are within the scope of this disclosure. For a square-shaped pixel sensor, the 2-micron outside width 318 may result in an outside diagonal width (e.g., between opposing corners of the square-shaped pixel sensor) of approximately 2.828 microns.

As further shown in FIG. 3C, another dimensional parameter of the DTI structure 306 may include a width (or thickness) 320 of the DTI structure 306. The width 320 of the DTI structure 306 may be greater than the width of the one or more refraction structures 308 to reduce and/or minimize the impact of the etch loading effect on the etch rate of the DTI structure 306. An example range for the width 320 may include approximately 70 nanometers to approximately 700 nanometers. However, other values for the width 320 are within the scope of this disclosure.

As further shown in FIG. 3C, another dimensional parameter of the DTI structure 306 may include a height (or depth) 322 of the DTI structure 306. The height 322 may be greater than the height of the one or more refraction structures 308 such that the DTI structure 306 extends downward around at least a portion of the sides of the photodiode 304 to provide sufficient crosstalk protection and to increase the reflection of photons toward the photodiode 304. Moreover, the height 322 of the DTI structure 306 may be less than the thickness of the substrate 302. As an example, the DTI structure 306 may be formed to a depth in a range of approximately 4 microns to approximately 5 microns where the thickness of the substrate 302 is approximately 6 microns to maintain structural stability of the substrate 302 and to provide sufficient optical and electrical crosstalk performance. In some implementations, other values for the depth of the DTI structure 306 are within the scope of this disclosure. In some implementations, the depth of the DTI structure 306 may be formed all the way through the thickness of the substrate 302 (e.g., a 6 micron DTI structure 306 for a 6 micron thick substrate 302).

FIG. 3D illustrates various dimensional parameters of the high absorption region 310. As shown in FIG. 3D, a dimensional parameter of the high absorption region 310 may include a width 324, and another dimensional parameter of the high absorption region 310 may include a height (or depth) 326. The height 326 of the high absorption region 310 may be included in a range of approximately 0.3 microns to approximately 0.8 microns. In some implementations, other values for the height 326 are within the scope of this disclosure. In some implementations, the width 324 of the high absorption region 310 may scale proportionally with the height 326 of the high absorption region 310 to ensure that the angle of the angled walls of the high absorption region 310 stays constant. In these examples, the width 324 of the high absorption region 310 may increase proportionally with an increase in the height 326 of the high absorption region 310, or may decrease proportionally with a decrease in the height 326 to ensure that the angle of the angled walls of the high absorption region 310 stays constant.

FIG. 3E illustrates various dimensional parameters of the one or more refraction structures 308. As shown in FIG. 3E, a dimensional parameter of a refraction structure 308 may include a width 328. The width 328 of the refraction structure 308 may be less than the width 320 of the DTI structure 306 to reduce and/or minimize the impact of the etch loading effect on the etch rate of the DTI structure 306. For example, the width 328 of the refraction structure 308 may be in a range of approximately 30 nanometers to approximately 350 nanometers so as to maintain a sufficient concentration of gas-phase etchants, during etching of the DTI structure 306 and the refraction structure 308, to effectively etch the DTI structure 306 to a particular depth. In this way, the width 328 of the refraction structure 308 may enable the etch rate of the DTI structure 306 and the etch rate of the refraction structure 308 to form the DTI structure 306 deeper relative to the refraction structure 308. In some implementations, other values for the width 328 are within the scope of this disclosure.

As further shown in FIG. 3E, another dimensional parameter of a refraction structure 308 may include a height (or depth) 330. The height 330 of a refraction structure 308 may be less than the height 322 of the DTI structure 306 so that the refraction structure 308 is spaced away from (and is not in contact with) the photodiode 304, which might otherwise reduce the dark current performance and/or the white pixel performance of the pixel sensor 300. As an example, the height 322 of a refraction structure 308 may be in a range of approximately 300 nanometers to approximately 2000 nanometers so that the bottom surface of the refraction structure 308 is spaced away from the photodiode 304. In some implementations, other values for the height 322 are within the scope of this disclosure.

As shown in FIG. 3F, etching of a refraction structure 308 may result in a plurality of different widths 328 of the refraction structure 308 along the height 330 or profile of the refraction structure 308. Etchant may accumulate in varying levels of concentration along the height 330 or profile of the refraction structure 308, which can result in greater amounts of the substrate 302 being removed in some areas and lesser amounts of the substrate 302 being removed in other areas. For example, the etchant concentration may be greater near a center of the height 330 of the refraction structure 308 (or near an upper portion of the refraction structure 308), and may be lower near a bottom of the height 330 of the refraction structure 308. Accordingly, in some implementations, a width 328a near a top of the refraction structure 308 may be less than a with 328b in an upper portion of the refraction structure 308. Moreover, the width 328b in the upper portion of the refraction structure 308 may be greater than a width 328c near a bottom of the refraction structure 308. An example range of the width 328a may be approximately 30 nanometers to approximately 350 nanometers. In some implementations, other values for the width 328a are within the scope of this disclosure. An example range of the width 328b may be approximately 50 nanometers to approximately 600 nanometers. In some implementations, other values for the width 328b are within the scope of this disclosure. An example range of the width 328c may be approximately 10 nanometers to approximately 300 nanometers. In some implementations, other values for the width 328c are within the scope of this disclosure.

As indicated above, FIGS. 3A-3F are provided as one or more examples. Other examples may differ from what is described with regard to FIGS. 3A-3F.

Figure 4B:
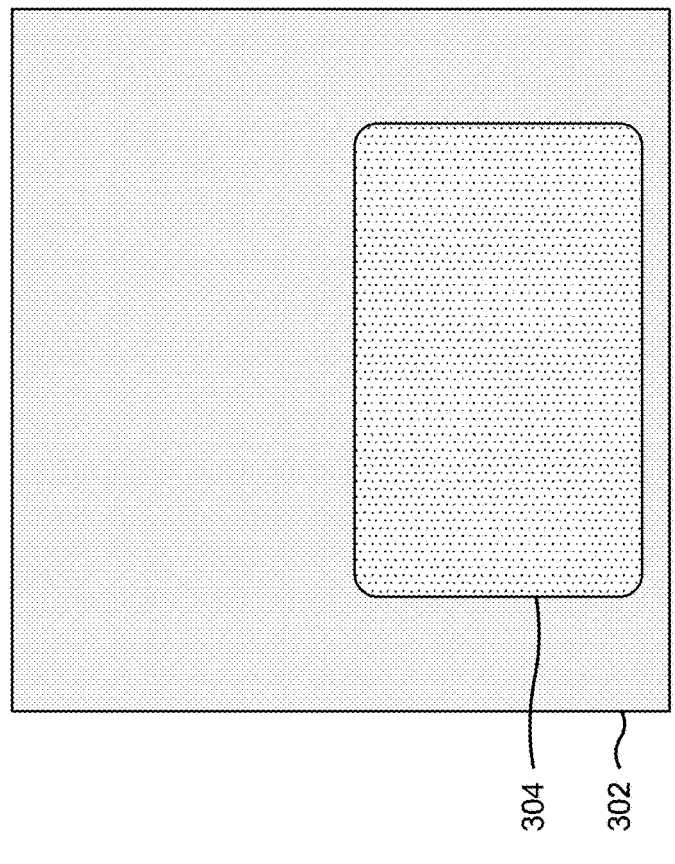

FIGS. 4A-4G are diagrams of an example implementation 400 described herein. Example implementation 400 may be an example process for forming the pixel sensor 300. As shown in FIG. 4A, the example process for forming the pixel sensor 300 may be performed in connection with (e.g., in and/or on) the substrate 302 of the pixel sensor 300.

As shown in FIG. 4B, one or more semiconductor processing tools may form the photodiode 304 in the substrate 302. For example, the ion implantation tool 114 may dope one or more portions of the substrate 302 by an ion implantation technique to form n-type regions and/or p-type regions of the photodiode 304 to form a p-n junction for the photodiode 304. For example, the ion implantation tool 114 may dope the substrate 302 with an n-type dopant to form an n-type region, and may dope the substrate 302 with a p-type dopant to form a p-type portion of the p-n junction. In some implementations, another technique is used to form the photodiode 304 such as diffusion.

As shown in FIG. 4C, the DTI structure 306 (e.g., the main DTI structure) may be formed in the substrate 302 such that the DTI structure 306 at least partially surrounds the photodiode 304. The DTI structure 306 may be formed from the top surface (or bottom surface for a BDTI structure) and into the substrate 302. The DTI structure 306 may form the perimeter of the pixel sensor 300. The DTI structure 306 may be formed such that a depth (or the height 322) of the DTI structure 306 is less than the thickness of the substrate 302. As an example, the DTI structure 306 may be formed to a depth in a range of approximately 4 microns to approximately 5 microns where the thickness of the substrate 302 is approximately 6 microns to maintain structural stability of the substrate 302 and to provide sufficient optical and electrical crosstalk performance. In some implementations, other values for the depth of the DTI structure 306 are within the scope of this disclosure.

As further shown in FIG. 4C, the one or more refraction structures 308 (e.g., the one or more sub-DTI structures) may be formed in the substrate 302 such that the one or more refraction structures 308 are located within the perimeter or internal boundary of the DTI structure 306. The one or more refraction structures 308 may be formed from the top surface (or bottom surface for sub-BDTI structures) into the substrate 302 above and/or over the photodiode 304.

The one or more refraction structures 308 may be formed such that the depth (or the height 330) of the one or more refraction structures 308 is less than the depth (or the height 322) of the DTI structure 306 so that the one or more refraction structures 308 do not touch (or are not in contact with) the photodiode 304, which might otherwise reduce the dark current performance and/or the white pixel performance of the pixel sensor 300. As an example, the one or more refraction structure 308 may be formed to a depth or a height in a range of approximately 300 nanometers to approximately 2000 nanometers so that the bottom surface of the one or more refraction structures 308 is spaced away from the photodiode 304. In some implementations, other values for the depth of the refraction structures 308 are within the scope of this disclosure.

The one or more refraction structures 308 may be formed such that the width 328 of the one or more refraction structures 308 is less than the width 320 of the DTI structure 306 to reduce and/or minimize the impact of the etch loading effect on the etch rate of the DTI structure 306. For example, the one or more refraction structures 308 may be formed to a width in a range of approximately 30 nanometers to approximately 350 nanometers so as to maintain a sufficient concentration of gas-phase etchants to effectively etch the DTI structure 306 to a particular depth. In this way, the one or more refraction structures 308 may be formed to a particular width such that the etch rate of the DTI structure 306 and the etch rate of the one or more refraction structures 308 result in the DTI structure 306 being deeper relative to the one or more refraction structures 308. In some implementations, other values for the width of the refraction structures 308 are within the scope of this disclosure.

In some implementations, at least one refraction structure 308 is formed such that the at least one refraction structure 308 is in contact with the DTI structure 306. In these examples, the at least one refraction structure 308 may be integrated into the DTI structure 306. In some implementations, at least one refraction structure 308 is formed such that the at least one refraction structure 308 is spaced away from (and is not in contact with) the DTI structure 306.

As further shown in FIG. 4C, the high absorption region 310 may be formed in the substrate 302 such that the high absorption region 310 is located within the perimeter or inner boundary of the DTI structure 306. Moreover, in implementations in which a plurality of refraction structures 308 are formed in the substrate 302, the high absorption region 310 may be formed in between the plurality of refraction structures 308. The one or more refraction structures 308 and/or the high absorption region 310 may be formed such that the one or more refraction structures 308 do not touch (or are not in contact with) the high absorption region 310, which might otherwise interfere with the operation of the high absorption region 310.

In some implementations, the DTI structure 306, the one or more refraction structures 308, and the high absorption region 310 are formed in a single etching operation (or in the same deposition operation). For example, the deposition tool 102 may form a photoresist layer on the substrate 302, the exposure tool 104 may expose the photoresist layer to a radiation source to pattern the photoresist layer based on a photomask, the developer tool 106 may develop and remove portions of the photoresist layer to expose the pattern, and the etch tool 108 may etch portions of the substrate 302 to form the DTI structure 306, the one or more refraction structures 308, and the high absorption region 310. In this way, a single photomask may be used to pattern the photoresist to form the DTI structure 306, the one or more refraction structures 308, and the high absorption region 310, which decreases the manufacturing complexity and processing time of the pixel sensor 300 relative to using separate photomasks, separate patterning operations, and separate etching operations to form the DTI structure 306, the one or more refraction structures 308, and the high absorption region 310. In some implementations, a photoresist removal tool removes the remaining portions of the photoresist layer (e.g., using a chemical stripper, a plasma asher, and/or another technique) after the etch tool 108 etches the substrate 302.

Figure 4D:
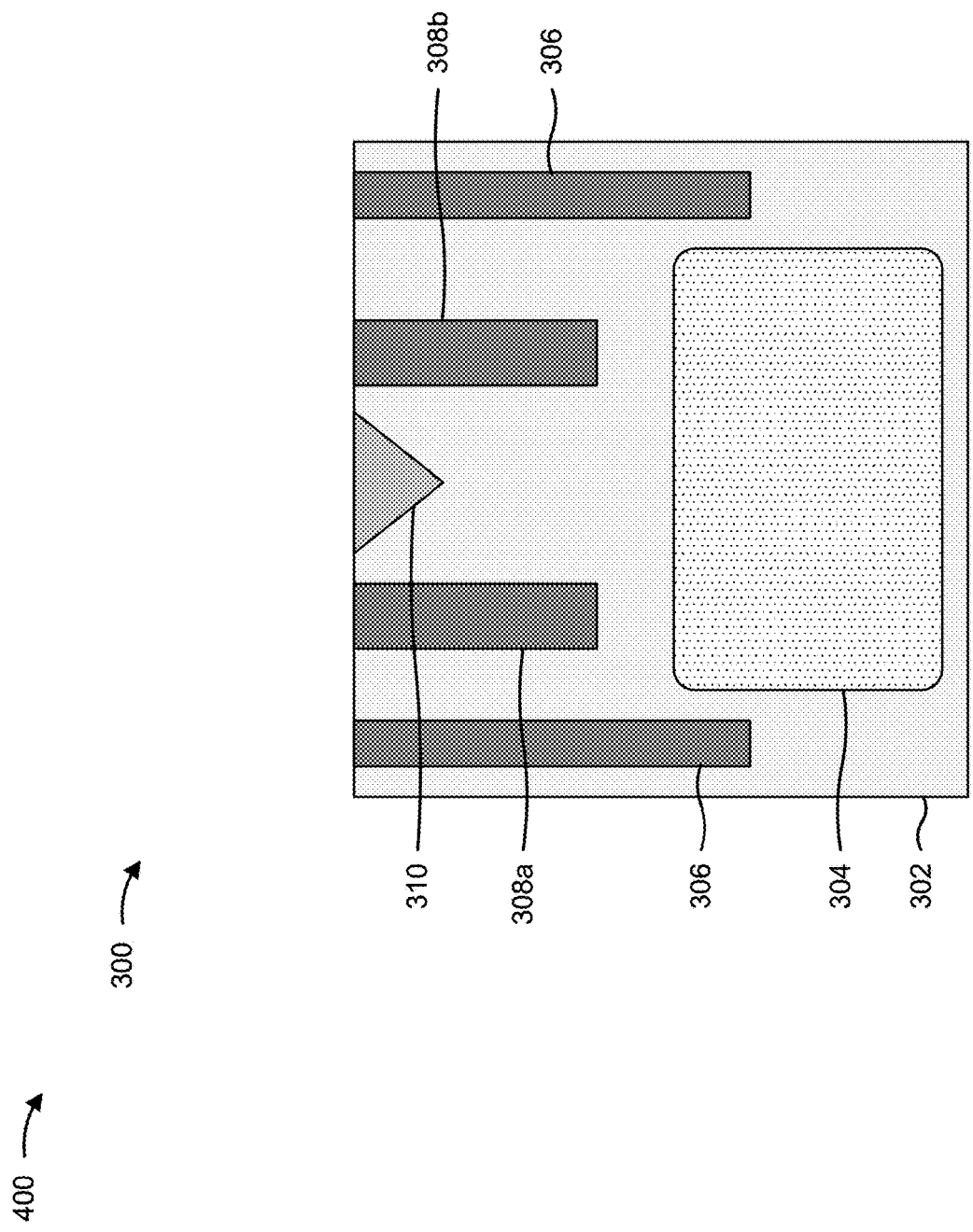

As shown in FIG. 4D, the DTI structure 306, the one or more refraction structures 308, and the high absorption region 310 may be filled with an oxide material such as a silicon oxide ($SiO_x$) or another oxide material. The deposition tool 102 may deposit the oxide material by a CVD technique, a PVD technique, an ALD technique, or another type of deposition technique. The planarization tool 110 may planarize the oxide material after the oxide material is deposited in the DTI structure 306, the one or more refraction structures 308, and the high absorption region 310. In some implementations, the deposition tool 102 deposits the oxide material in the DTI structure 306, the one or more refraction structures 308, and the high absorption region 310 in a single deposition operation (or in the same operations), which may reduce the manufacturing complexity and processing time to fill the DTI structure 306, the one or more refraction structures 308, and the high absorption region 310 relative to filling the DTI structure 306, the one or more refraction structures 308, and the high absorption region 310 in separate deposition operations.

Figure 4E:
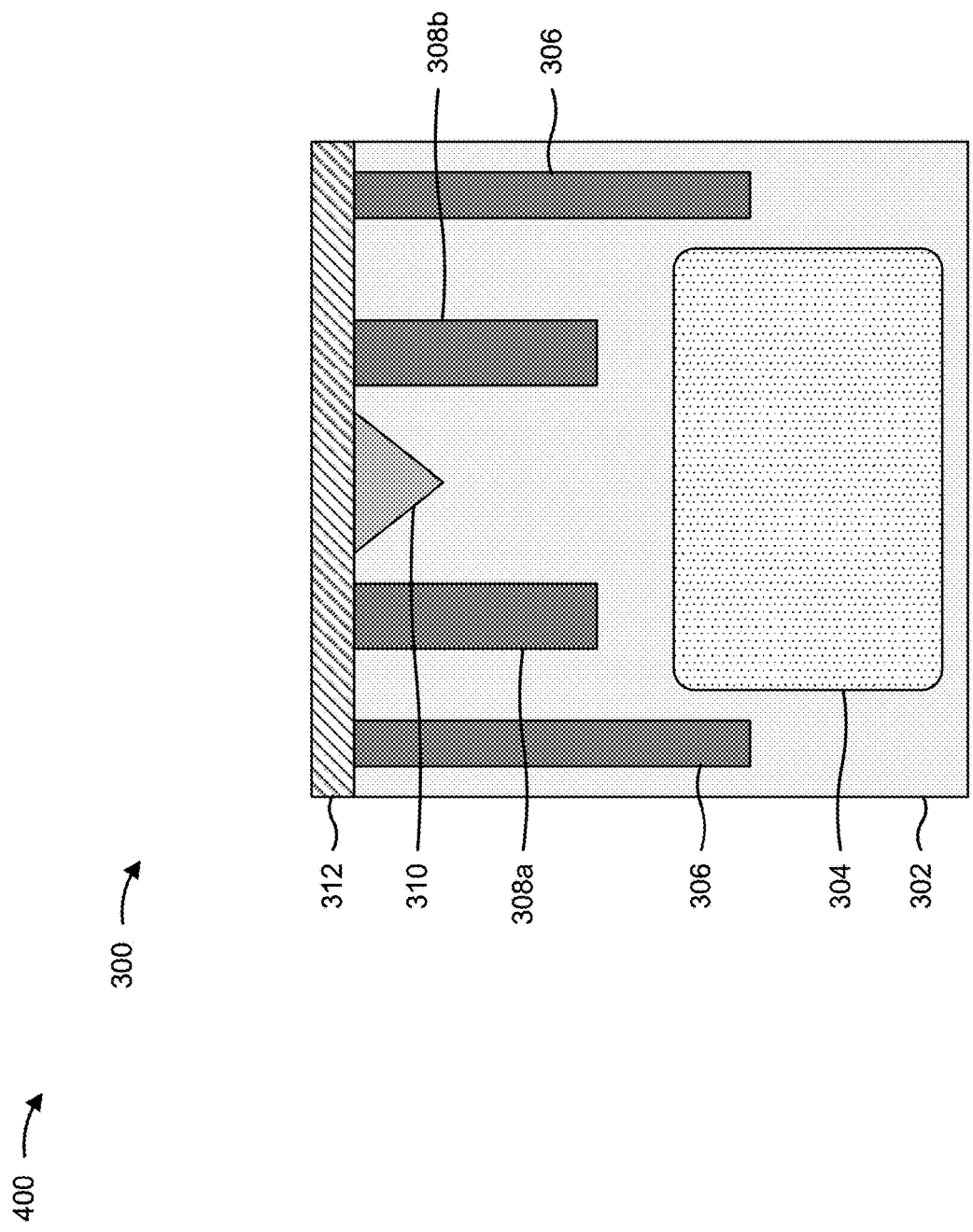

As shown in FIG. 4E, the ARC 312 may be formed on the top surface of the substrate 302 over the DTI structure 306, the one or more refraction structures 308, and the high absorption region 310. The deposition tool 102 may deposit the ARC 312 using a CVD technique, a PVD technique, an ALD technique, or another type of deposition technique. The planarization tool 110 may planarize the ARC 312 after the ARC 312 is deposited.

Figure 4F:
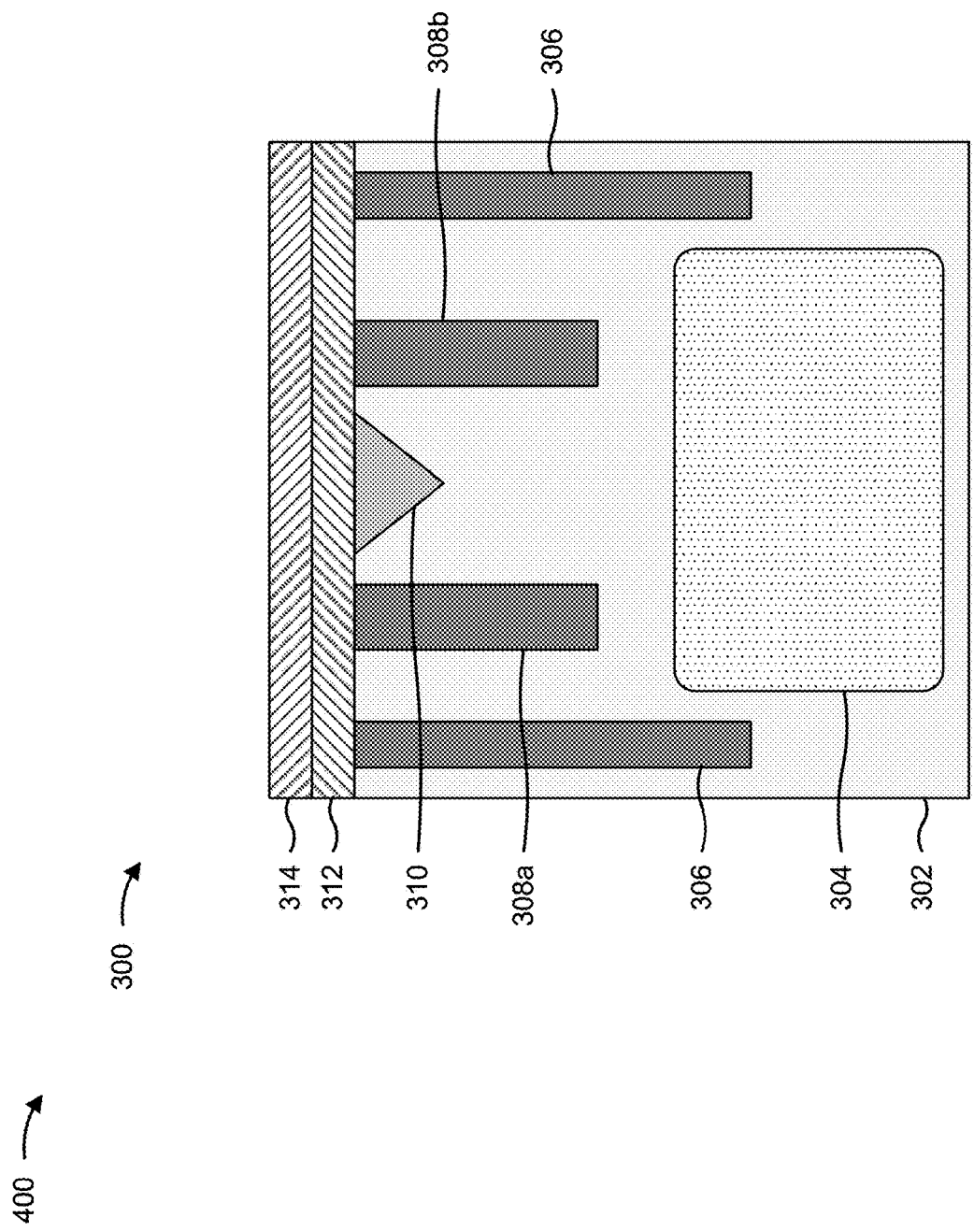

As shown in FIG. 4F, the color filter layer 314 may be formed over the top surface of the substrate 302 on the ARC 312. The deposition tool 102 may deposit the color filter layer 314 using a CVD technique, a PVD technique, an ALD technique, or another type of deposition technique. The planarization tool 110 may planarize the color filter layer 314 after the color filter layer 314 is deposited.

Figure 4G:
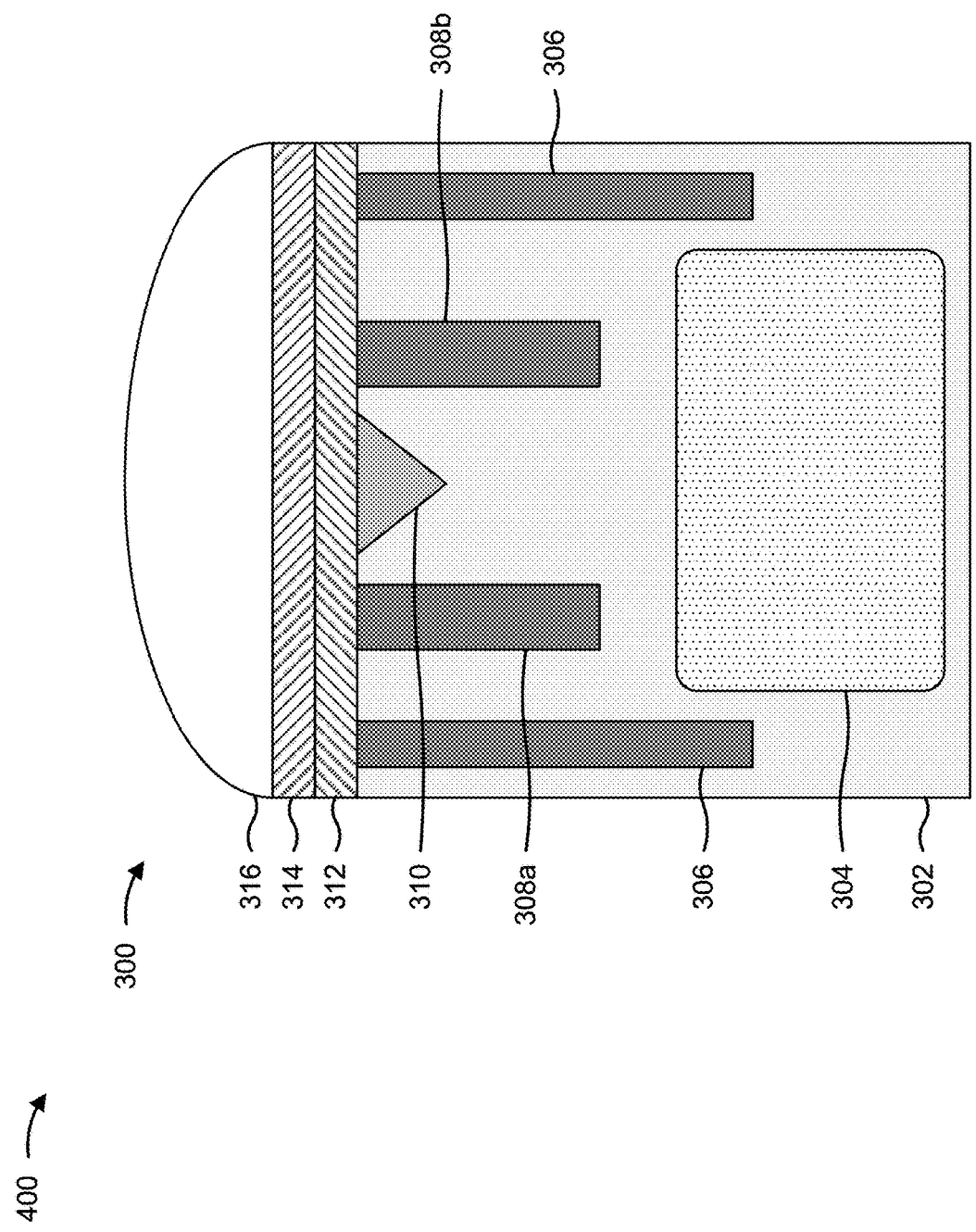

As shown in FIG. 4G, the micro-lens layer 316 may be formed over the top surface of the substrate 302 on the color filter layer 314. The deposition tool 102 may deposit the micro-lens layer 316 using a CVD technique, a PVD technique, an ALD technique, or another type of deposition technique.

As indicated above, FIGS. 4A-4G are provided as one or more examples. Other examples may differ from what is described with regard to FIGS. 4A-4G.

Figure 5:
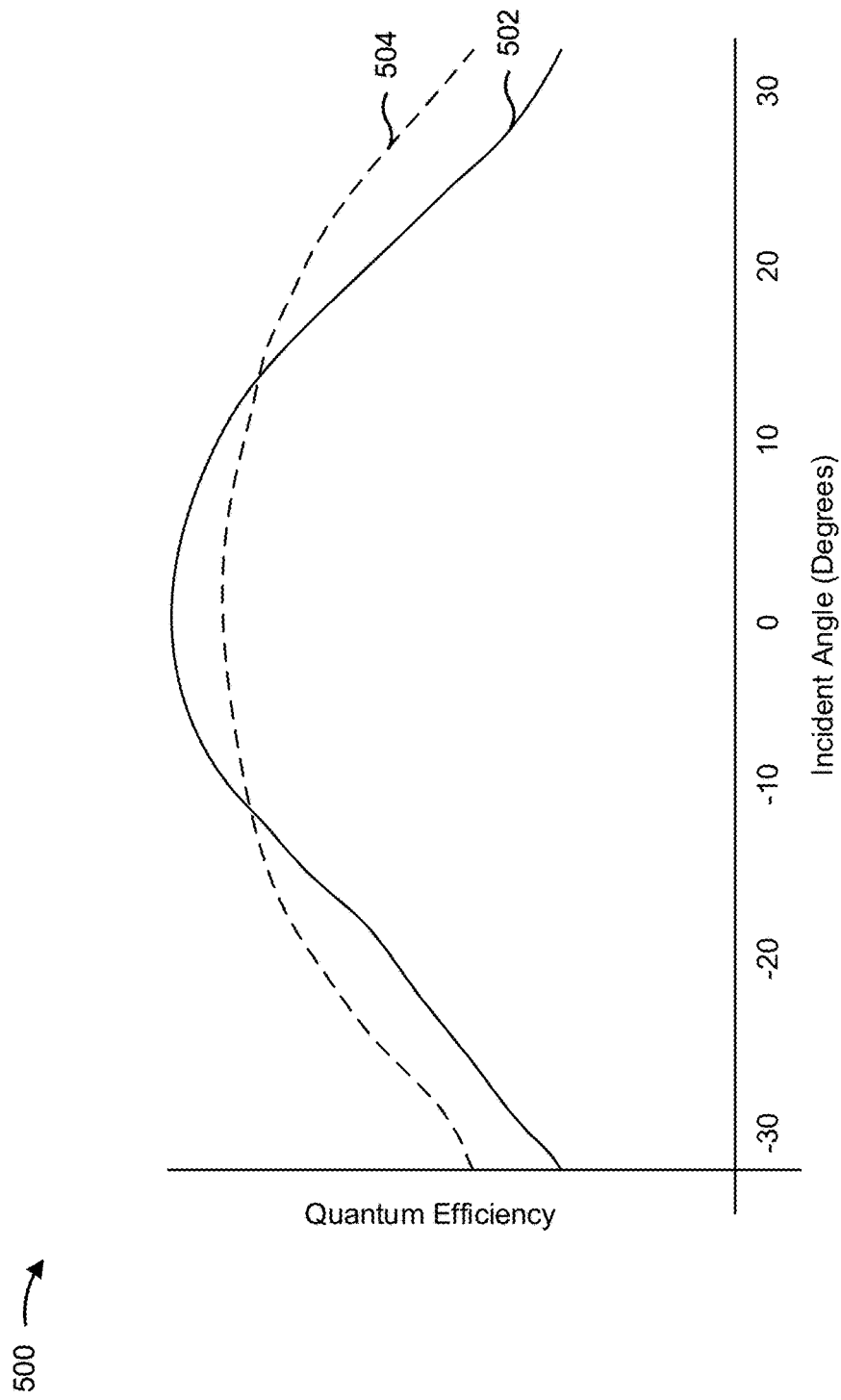
FIG. 5 is a diagram of quantum efficiency performance data described herein.

FIG. 5 is a diagram 500 of quantum efficiency performance data described herein. Diagram 500 illustrates examples of differences in quantum efficiency performance across a range of incident angles for the pixel sensor 300 including the one or more refraction structures 308 to reduce the reflection of incident light at wide incident angles and another pixel sensor that does not include the one or more refraction structures 308.

As shown in FIG. 5, the diagram 500 may include a range from an incident angle of approximately −30 degrees to an incident angle of approximately 30 degrees. In some implementations, the pixel sensor 300 including the one or more refraction structures 308 are capable of refracting incident light to increase quantum efficiency across a wider range or a different range, which are within the scope of this disclosure. The data line 502 corresponds to the pixel sensor that does not include the one or more refraction structures 308, and the data line 504 corresponds to the pixel sensor 300 including the one or more refraction structures 308. As shown by the data lines 502 and 504, the quantum efficiency performance of the pixel sensor that does not include the one or more refraction structures 308 may be slightly greater at narrower incident angles (e.g., incident angles below approximately +/−10 degrees) relative to the pixel sensor 300. However, the pixel sensor 300 achieves a more consistent quantum efficiency performance across a greater range of incident angles, and out-performs the pixel sensor that does not include the one or more refraction structures 308 at incident angles wider than +/−10 degrees. In some implementations, the pixel sensor 300 may achieve a more consistent quantum efficiency performance at incident angles different from +/−10 degrees.

As indicated above, FIG. 5 is provided as an example. Other examples may differ from what is described with regard to FIG. 5.

FIGS. 6A-6D are diagrams of example pixel sensor configurations described herein. The example pixel sensor configurations illustrated in FIGS. 6A-6D may be included or implemented in a pixel sensor 202 and/or the pixel sensor 300 including the one or more refraction structures 308.

Figure 6B:
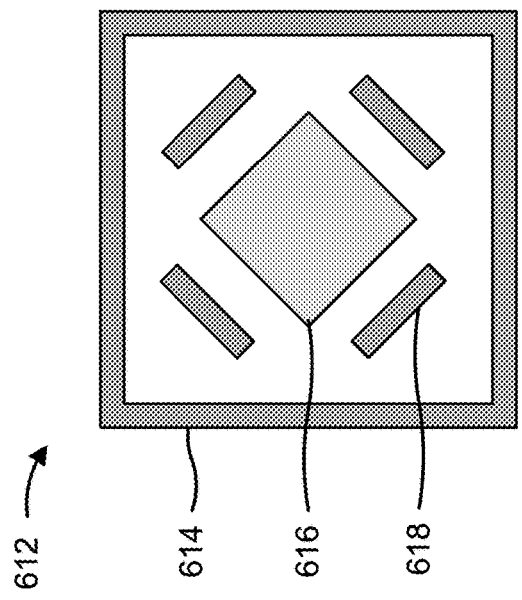
FIGS. 6A-6D are diagrams of example pixel sensor configurations described herein.
Figure 6D:
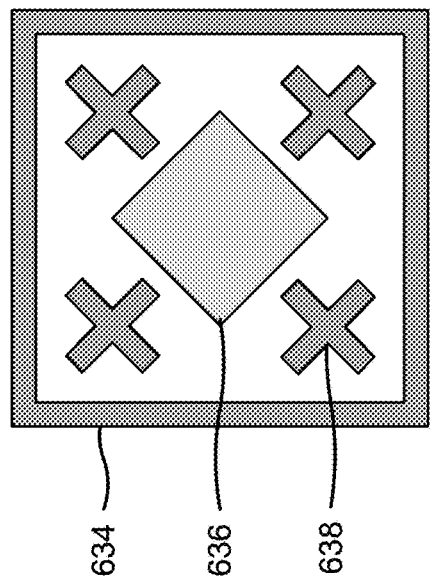
Figure 6A:
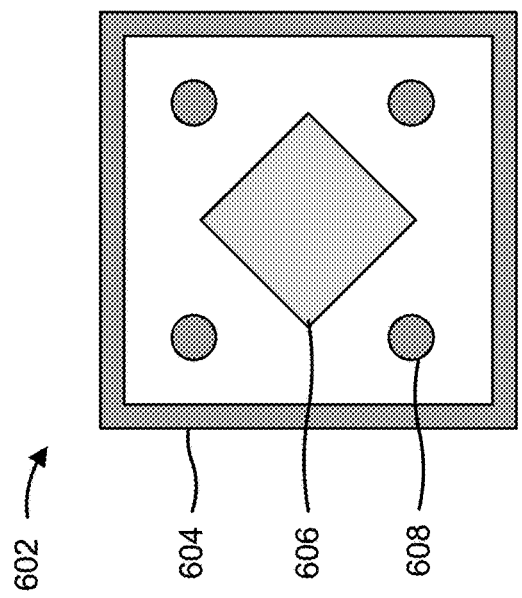

FIG. 6A illustrates a top-down view of an example pixel sensor configuration 602. As shown in FIG. 6A, the example pixel sensor configuration 602 may include a DTI structure 604 around the perimeter of the pixel sensor, high absorption region 606 near a center of the pixel sensor, and a plurality of refraction structures 608 between the high absorption region 606 and the DTI structure 604. Each refraction structure 608 may be located near a respective side of the high absorption region 606. For example, a first refraction structure 608 may be located near a first side of the high absorption region 606, a second refraction structure 608 may be located near a second side of the high absorption region 606, a third refraction structure 608 may be located near a third side of the high absorption region 606, and a fourth refraction structure 608 may be located near a fourth side of the high absorption region 606. As further shown in FIG. 6A, the plurality of refraction structures 608 may include circular-shaped refraction structures in the top-down view (which may include cylindrical-shaped three-dimensional refraction structures).

FIG. 6B illustrates a top-down view of an example pixel sensor configuration 612. As shown in FIG. 6B, the example pixel sensor configuration 612 may include a DTI structure 614 around the perimeter of the pixel sensor, high absorption region 616 near a center of the pixel sensor, and a plurality of refraction structures 618 between the high absorption region 616 and the DTI structure 614. As further shown in FIG. 6B, the plurality of refraction structures 618 may include rectangular-shaped refraction structures in the top-down view (which may include rectangular prism-shaped three-dimensional refraction structures). The rectangular-shaped refraction structures may be positioned such that the long sides of the rectangular-shaped refraction structures are facing the sides of the high absorption region 616.

Figure 6C:
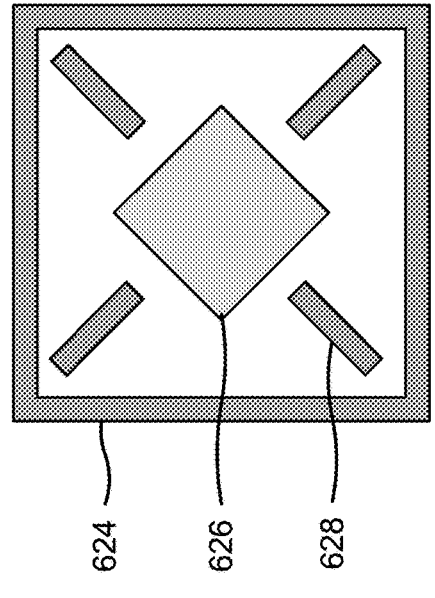

FIG. 6C illustrates a top-down view of an example pixel sensor configuration 622. As shown in FIG. 6C, the example pixel sensor configuration 622 may include a DTI structure 624 around the perimeter of the pixel sensor, high absorption region 626 near a center of the pixel sensor, and a plurality of refraction structures 628 between the high absorption region 626 and the DTI structure 624. As further shown in FIG. 6C, the plurality of refraction structures 628 may include rectangular-shaped refraction structures in the top-down view (which may include rectangular prism-shaped three-dimensional refraction structures). The rectangular-shaped refraction structures may be positioned such that the short sides of the rectangular-shaped refraction structures are facing the sides of the high absorption region 626 (e.g., such that the rectangular-shaped refraction structures are rotated approximately 90 degrees relative to the rectangular-shaped refraction structures illustrated in FIG. 6B).

FIG. 6D illustrates a top-down view of an example pixel sensor configuration 632. As shown in FIG. 6D, the example pixel sensor configuration 632 may include a DTI structure 634 around the perimeter of the pixel sensor, high absorption region 636 near a center of the pixel sensor, and a plurality of refraction structures 638 between the high absorption region 636 and the DTI structure 634. As further shown in FIG. 6D, the plurality of refraction structures 638 may include cross-shaped refraction structures in the top-down view.

As indicated above, FIGS. 6A-6D are provided as examples. Other examples may differ from what is described with regard to FIGS. 6A-6D.

Figure 7:
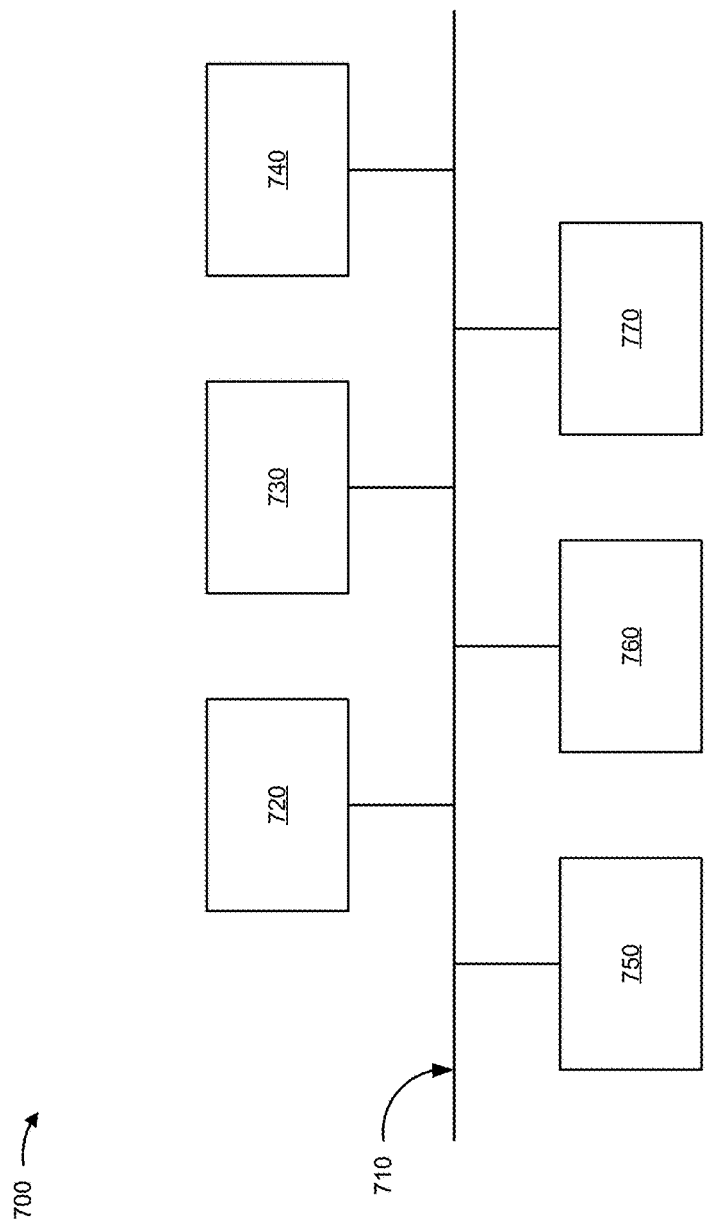
FIG. 7 is a diagram of example components of one or more devices of FIG. 1.

FIG. 7 is a diagram of example components of a device 700. In some implementations, one or more of the semiconductor processing tools 102-114 and/or the wafer/die transport tool 116 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

FIG. 8 is a flowchart of an example process 800 associated with pixel sensor including refraction structures. In some implementations, one or more process blocks of FIG. 8 may be performed by a one or more semiconductor processing tools (e.g., one or more of the semiconductor processing tools 102-114). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include forming, in a substrate of a pixel sensor, a first DTI structure at least partially surrounding a photodiode in the substrate (block 810). For example, the one or more semiconductor processing tools 102-114 may form, in the substrate 302 of the pixel sensor 300, a first DTI structure (e.g., the DTI structure 306, 604, 614, 624, and/or 634) at least partially surrounding the photodiode 304 in the substrate 302, as described above.

As further shown in FIG. 8, process 800 may include forming, in the substrate, a plurality of second DTI structures over the photodiode and within a perimeter of the first DTI structure (block 820). For example, the one or more semiconductor processing tools 102-114 may form, in the substrate 302, a plurality of second DTI structures (e.g., a plurality of refraction structures 308, 608, 618, 628, and/or 638) over the photodiode 304 and within a perimeter of the first DTI structure, as described above.

As further shown in FIG. 8, process 800 may include forming, in the substrate, a high absorption region over the photodiode and in between the plurality of second DTI structures (block 830). For example, the one or more semiconductor processing tools 102-114 may form, in the substrate 302, a high absorption region (e.g., the high absorption region 310, 606, 616, 626, and/or 636) over the photodiode 304 and in between the plurality of second DTI structures, as described above.

As further shown in FIG. 8, process 800 may include filling the first DTI structure, the plurality of second DTI structures, and the high absorption region with an oxide material (block 840). For example, the one or more semiconductor processing tools 102-114 may fill the first DTI structure, the plurality of second DTI structures, and the high absorption region with an oxide material, as described above.

Process 800 may include additional implementations, such as any single implementation or any combination of implementations described below and/or in connection with one or more other processes described elsewhere herein.

In a first implementation, forming the first DTI structure and forming the plurality of second DTI structures include forming the first DTI structure and forming the plurality of second DTI structures using a same photomask. In a second implementation, alone or in combination with the first implementation, filling the first DTI structure, the plurality of second DTI structures, and the high absorption region with the oxide material includes filling at least the first DTI structure and the plurality of second DTI structures with the oxide material in a same deposition operation.

In a third implementation, alone or in combination with one or more of the first and second implementations, forming the plurality of second DTI structures includes forming the plurality of second DTI structures to a depth, relative to a top surface of the substrate, such that the plurality of second DTI structures do not touch the photodiode. In a fourth implementation, alone or in combination with one or more of the first through third implementations, the depth of the plurality of second DTI structures is in a range of approximately 300 nanometers to approximately 2000 nanometers, and the depth of the plurality of second DTI structures is less than a depth of the first DTI structure.

In a fifth implementation, alone or in combination with one or more of the first through fourth implementations, forming the plurality of second DTI structures includes forming the plurality of second DTI structures to a particular width such that an etch rate of the first DTI structure and the plurality of second DTI structures results in the first DTI structure being deeper relative to the plurality of second DTI structures. In a sixth implementation, alone or in combination with one or more of the first through fifth implementations, forming the plurality of second DTI structures comprises forming a third DTI structure, of the plurality of second DTI structures, near a first side of the high absorption region, forming a fourth DTI structure, of the plurality of second DTI structures, near a second side of the high absorption region, forming a fifth DTI structure, of the plurality of second DTI structures, near a first third of the high absorption region, and forming a sixth DTI structure, of the plurality of second DTI structures, near a fourth side of the high absorption region.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a pixel sensor that includes a main DTI structure and one or more sub-DTI structures in a substrate of the pixel sensor to increase the quantum efficiency of the pixel sensor at large incident angles. The main DTI structure may at least partially surround the photodiode of the pixel sensor, and may be configured to reduce crosstalk and reflect incident light toward the photodiode. The one or more sub-DTI structures may be included at various locations within the perimeter of the main DTI structure and above photodiode. The one or more sub-DTI structures may be configured to provide a path of travel for incident light into the photodiode from large incident angles in that the one or more sub-DTI structures may be filled with an oxide material to increase light penetration into the one or more sub-DTI structures. This may reduce reflections at the top surface of the substrate, thereby permitting incident light to refract into the substrate and toward the photodiode. Accordingly, the one or more sub-DTI structures may increase the quantum efficiency of the pixel sensor at large incident angles, may reduce optical crosstalk, and/or may increase the low-light performance of a camera in which the pixel sensor is included.

As described in greater detail above, some implementations described herein provide a pixel sensor. The pixel sensor includes a photodiode in a substrate of the pixel sensor. The pixel sensor includes a DTI structure at least partially surrounding the photodiode in the substrate. The pixel sensor includes a plurality of refraction structures above the photodiode and within a perimeter of the DTI structure in the substrate.

As described in greater detail above, some implementations described herein provide a method. The method includes forming, in a substrate of a pixel sensor, a first DTI structure at least partially surrounding a photodiode in the substrate. The method includes forming, in the substrate, a plurality of second DTI structures over the photodiode and within a perimeter of the first DTI structure. The method includes forming, in the substrate, a high absorption region over the photodiode and in between the plurality of second DTI structures. The method includes filling the first DTI structure, the plurality of second DTI structures, and the high absorption region with an oxide material.

As described in greater detail above, some implementations described herein provide a pixel sensor. The pixel sensor includes a photodiode included in a substrate of the pixel sensor. The pixel sensor includes a high absorption region over approximately a center of the photodiode in the substrate. The pixel sensor includes a DTI structure at least partially surrounding the photodiode in the substrate. The pixel sensor includes a plurality of refraction structures, within a perimeter of the DTI structure, extending from a top surface of the substrate toward the photodiode, where each of the plurality of refraction structures is located near a respective side of the high absorption region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel sensor, comprising:
a substrate;
a photodiode, wherein all sides of the photodiode are surrounded by the substrate;
a first deep trench isolation (DTI) structure, at least partially surrounding the photodiode, in the substrate;
a plurality of refraction structures within an outer perimeter of the photodiode,
wherein the first DTI structure and plurality of refraction structures extend from a same end of the substrate, and
wherein, in a cross-section view of the pixel sensor, the plurality of refraction structures are completely above the photodiode and are further within a perimeter of the first DTI structure;
a plurality of second DTI structures within the outer perimeter of the photodiode; and
a high absorption region between the plurality of second DTI structures and over the photodiode, wherein the high absorption region has a different shape than the plurality of second DTI structures.

2. The pixel sensor of claim 1,
wherein the high absorption region is over approximately a center of the photodiode.

3. The pixel sensor of claim 1,
wherein the plurality of refraction structures are spaced away from the high absorption region.

4. The pixel sensor of claim 1,
wherein the plurality of refraction structures are configured to refract incident light toward the photodiode.

5. The pixel sensor of claim 1,
wherein a width of at least one of the plurality of refraction structures is less than a width of the first DTI structure.

6. The pixel sensor of claim 1,
wherein a height of at least one of the plurality of refraction structures is less than a height of the first DTI structure.

7. The pixel sensor of claim 1,
wherein at least one of the plurality of refraction structures comprises:
a third DTI structure,
a shallow trench isolation (STI) structure,
a circle-shaped refraction structure,
a rectangle-shaped refraction structure, or
a cross-shaped refraction structure.

8. A pixel sensor, comprising:
a substrate;
a photodiode, wherein all sides of the photodiode are surrounded by the substrate;
a high absorption region over approximately a center of the photodiode in the substrate;
a first deep trench isolation (DTI) structure, at least partially surrounding the photodiode in the substrate, extending from a top surface of the substrate;
a plurality of refraction structures, within an inner perimeter of the first DTI structure and an outer perimeter of the photodiode, extending from the top surface of the substrate toward the photodiode,
wherein each of the plurality of refraction structures is located near a respective side of the high absorption region, and
wherein at least one of the plurality of refraction structures comprises:
a first width in a range of approximately 30 nanometers to approximately 350 nanometers,
a second width in a range of approximately 50 nanometers to approximately 600 nanometers, and
a third width in a range of approximately 10 nanometers to approximately 300 nanometers;
a plurality of second DTI structures within the outer perimeter of the photodiode; and
a high absorption region between the plurality of second DTI structures and over the photodiode, wherein the high absorption region has a different shape than the plurality of second DTI structures.

9. The pixel sensor of claim 8,
wherein the plurality of refraction structures are configured to promote absorption of near infrared (NIR) light by the photodiode.

10. The pixel sensor of claim 8,
wherein the plurality of refraction structures are configured to promote absorption of incident light at angles of incidence greater than approximately 10 degrees.

11. The pixel sensor of claim 8,
wherein a width of at least one of the plurality of refraction structures is less than a width of the first DTI structure.

12. The pixel sensor of claim 8,
wherein a height of at least one of the plurality of refraction structures is less than a height of the first DTI structure.

13. The pixel sensor of claim 8,
wherein a width of each of the plurality of refraction structures is less than a width of the first DTI structure.

14. A pixel sensor, comprising:
a substrate;
a photodiode, wherein all sides of the photodiode are surrounded by the substrate;
a first deep trench isolation (DTI) structure at least partially surrounding the photodiode in the substrate;
a plurality of second DTI structures within an outer perimeter of the photodiode,
wherein the DTI structure and plurality of refraction structures extend from a same end of the substrate, and
wherein, in a cross-section view of the pixel sensor, the plurality of second DTI structures are completely over a perimeter of the photodiode and are further within a perimeter of the first DTI structure; and
a high absorption region between the plurality of second DTI structures and over the photodiode, wherein the high absorption region is a different shape than the plurality of second DTI structures.

15. The pixel sensor of claim 14,
wherein a width of at least one of the plurality of second DTI structures is less than a width of the first DTI structure.

16. The pixel sensor of claim 14,
wherein a height of at least one of the plurality of second DTI structures is less than a height of the first DTI structure.

17. The pixel sensor of claim 14,
wherein the plurality of second DTI structures are configured to promote absorption of near infrared (NIR) light by the photodiode.

18. The pixel sensor of claim 14,
wherein at least one of plurality of refraction structures comprises at least one of:
   a first width in a range of approximately 30 nanometers to approximately 350 nanometers,
   a second width in a range of approximately 50 nanometers to approximately 600 nanometers, or
   a third width in a range of approximately 10 nanometers to approximately 300 nanometers.

19. The pixel sensor of claim 14,
wherein a width of each of the plurality of second DTI structures is less than a width of the first DTI structure.

20. The pixel sensor of claim 14,
wherein at least one of the plurality of second DTI structures has a plurality of different widths.

\* \* \* \* \*